US012796268B2

(12) United States Patent
Song et al.

(10) Patent No.: US 12,796,268 B2
(45) Date of Patent: Nov. 10, 2026

(54) DISPLAY PANEL AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Erlong Song, Beijing (CN); Hailong Yan, Beijing (CN); Kai Zhang, Beijing (CN); Gang Wang, Beijing (CN); Xinyu Wei, Beijing (CN); Yagui Gao, Beijing (CN); Xingrui Cai, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 421 days.

(21) Appl. No.: 18/560,687

(22) PCT Filed: Oct. 22, 2021

(86) PCT No.: PCT/CN2021/125517
§ 371 (c)(1),
(2) Date: Nov. 14, 2023

(87) PCT Pub. No.: WO2022/247119
PCT Pub. Date: Dec. 1, 2022

(65) Prior Publication Data

US 2024/0292700 A1 Aug. 29, 2024

(30) Foreign Application Priority Data

May 26, 2021 (CN) ........................ 202110578662.7

(51) Int. Cl.
*H10K 59/35* (2023.01)
*H10K 59/122* (2023.01)
*H10K 102/00* (2023.01)

(52) U.S. Cl.
CPC ......... *H10K 59/353* (2023.02); *H10K 59/122* (2023.02); *H10K 59/352* (2023.02); *H10K 2102/351* (2023.02)

(58) Field of Classification Search
CPC .. H10K 59/353; H10K 59/122; H10K 59/352; H10K 2102/351; H10K 59/35; H10K 59/12
See application file for complete search history.

(56) References Cited

U.S. PATENT DOCUMENTS

2006/0232199 A1 10/2006 Takahashi
2016/0268354 A1 9/2016 Xiong et al.
(Continued)

FOREIGN PATENT DOCUMENTS

CN 104659070 A 5/2015
CN 105590954 A 5/2016
(Continued)

OTHER PUBLICATIONS

International Search Report for PCT/CN2021/125517 Mailed Jan. 28, 2022.
(Continued)

*Primary Examiner* — Elmito Breval

(57) ABSTRACT

A display panel comprises: a base substrate; a first electrode layer, which is located on one side of the base substrate, and comprises a plurality of first electrodes; a pixel defining layer, which is located on the side of the first electrode layer that faces away from the base substrate, and comprises a plurality of sub-pixel opening regions; a common layer, which is located on the sides of the first electrodes that face
(Continued)

away from the base substrate, covers the pixel defining layer, and is used for transferring a hole or an electron; and a second electrode layer, which is located on the side of the common layer that faces away from the base substrate. The display panel further comprises an extension structure, which is located on the side of the pixel defining layer that faces away from the base substrate, is located between adjacent sub-pixel opening regions.

17 Claims, 18 Drawing Sheets

(56) References Cited

U.S. PATENT DOCUMENTS

| | | | |
|---|---|---|---|
| 2018/0301521 A1 | 10/2018 | Yang | |
| 2020/0119114 A1* | 4/2020 | Kim | H10K 59/122 |
| 2023/0180527 A1 | 6/2023 | Yang et al. | |

FOREIGN PATENT DOCUMENTS

| | | |
|---|---|---|
| CN | 106876331 A | 6/2017 |
| CN | 107346778 A | 11/2017 |
| CN | 111599851 A | 8/2020 |
| CN | 113314579 A | 8/2021 |

OTHER PUBLICATIONS

Office Action dated Mar. 28, 2022 for Chinese Patent Application No. 202110578662.7 and English Translation.

* cited by examiner

24

DISPLAY PANEL AND DISPLAY APPARATUS

CROSS-REFERENCE TO RELATED APPLICATION

The present application is a U.S. National Phase Entry of International Application PCT/CN2021/125517 having an international filing date of Oct. 22, 2021, which claims priority of Chinese patent application No. 202110578662.7, entitled "Display Panel and Display Apparatus", and filed to the CNIPA on May 26, 2021, the contents of which are hereby incorporated herein by reference in their entireties.

TECHNICAL FIELD

The present disclosure relates to the field of display technologies, and particularly to a display panel and a display apparatus.

BACKGROUND

A light emitting device structure of an Active Matrix/Organic Light Emitting Diode (AMOLED) display screen includes an anode, a hole injection layer, a hole transport layer, a light emitting layer, a cathode and so on. Because the hole injection layer and the hole transport layer can transport charge and can be evaporated by whole surfaces in a pixel light emitting region. When a certain pixel emits light, charges can enter adjacent pixels through the hole injection layer and the hole transport layer, so that the adjacent pixels will produce a phenomenon of a lateral leakage of electricity through a conductive layer.

SUMMARY

An embodiment of the present disclosure provides a display panel, the display panel includes:

a base substrate;

a first electrode layer located on a side of the base substrate and including multiple first electrodes;

a pixel definition layer located on a side of the first electrode layer facing away from the base substrate and including multiple sub-pixel opening regions;

a common layer located on a side of the first electrode facing away from the base substrate and covering the pixel definition layer for transferring holes or electrons;

a second electrode layer located on a side of the common layer facing away from the base substrate;

the display panel further includes:

extension structures located between the common layer and the base substrate, and located between adjacent sub-pixel opening regions; the extended structures are configured to increase a difficulty in transferring the holes or the electrons.

In some embodiments, the extension structures are covered by the common layer and the extension structures at least partially surrounds the sub-pixel opening regions.

In some embodiments, the extension structures are extension parts located between the pixel definition layer and the common layer;

a distance between a surface of an extension part away from the base substrate and the base substrate is greater than a distance between a surface of the pixel definition layer away from the base substrate and the base substrate.

In some embodiments, each extension structure is a recessed structure provided on the pixel definition layer;

in a direction from the base substrate towards the pixel definition layer, a cross-sectional area of the recessed structure gradually decreases.

In some embodiments, the extension structures surrounding different sub-pixel opening regions are integrally connected.

In some embodiments, multiple extension structures are included between the adjacent sub-pixel opening regions.

In some embodiments, the display panel further includes:

multiple support parts located between the pixel definition layer and the common layer; an orthographic projection of the support parts on the base substrate is not overlapped with an orthographic projection of the extension structures on the base substrate.

In some embodiments, when an extension structure includes an extension part, a thickness of the support parts in a direction perpendicular to the base substrate is greater than a thickness of the extension part.

In some embodiments, the multiple sub-pixel opening regions includes: first color sub-pixel opening regions, second color sub-pixel opening regions, and third color sub-pixel opening regions;

the multiple sub-pixel opening regions are arranged into multiple sub-pixel columns; the multiple sub-pixel columns are arranged in a first direction, each of the sub-pixel columns extends in a second direction, and the first direction intersects with the second direction;

the multiple sub-pixel columns includes: multiple first sub-pixel columns and second sub-pixel columns, the second sub-pixel columns are provided to be spaced apart from the first sub-pixel columns;

in each first sub-pixel column, first color sub-pixel opening regions and second color sub-pixel opening regions are alternately provided along the second direction; in each second sub-pixel column, first color sub-pixel opening regions and third color sub-pixel opening regions are alternately provided along the second direction;

in the first direction, each second color sub-pixel opening region is adjacent to a first color sub-pixel opening region, and each third color sub-pixel opening region is adjacent to a first color sub-pixel opening region;

in the first sub-pixel column, a minimum distance between an edge of a first color sub-pixel opening region and an edge of a side of a first electrode in the second direction is greater than a minimum distance between an edge of the first color sub-pixel opening region and an edge of the first electrode in the first direction; and in the second sub-pixel column, a minimum distance between an edge of a first color sub-pixel opening region and an edge of a first electrode in the first direction is smaller than a minimum distance between an edge of the first color sub-pixel opening region and an edge of a side of the first electrode in the second direction.

In some embodiments, a minimum distance between an edge of the first color sub-pixel opening region and an edge of the first electrode is greater than a minimum distance between an edge of the third color sub-pixel opening region and an edge of the first electrode.

In some embodiments, a minimum distance between an edge of a first color sub-pixel opening region and an edge of an adjacent third color sub-pixel opening region is greater than a minimum distance between an edge of the first color sub-pixel opening region and an edge of another adjacent third color sub-pixel opening region.

In some embodiments, a minimum distance between an edge of a first color sub-pixel opening region and an edge of an adjacent second color sub-pixel opening region is greater than a minimum distance between an edge of the first color sub-pixel opening region and an edge of another adjacent second color sub-pixel opening region.

In some embodiments, a minimum distance between an edge of a second color sub-pixel opening region and an edge of a first electrode is greater than a minimum distance between an edge of a third color sub-pixel opening region and an edge of the first electrode.

In some embodiments, an edge of a side of the first color sub-pixel opening region close to a second color sub-pixel opening region is recessed toward the first color sub-pixel opening region.

An embodiment of the present disclosure provides a display apparatus, including the display panel provided by an embodiment of the present disclosure.

BRIEF DESCRIPTION OF DRAWINGS

In order to describe technical solutions in embodiments of the present disclosure more clearly, the drawings to be used in the embodiments will be introduced below in brief. Apparently, the drawings described below are only some of the embodiments of the present disclosure, and one skilled in the art may obtain other drawings according to these drawings without paying any inventive effort.

DETAILED DESCRIPTION

Figure 1:
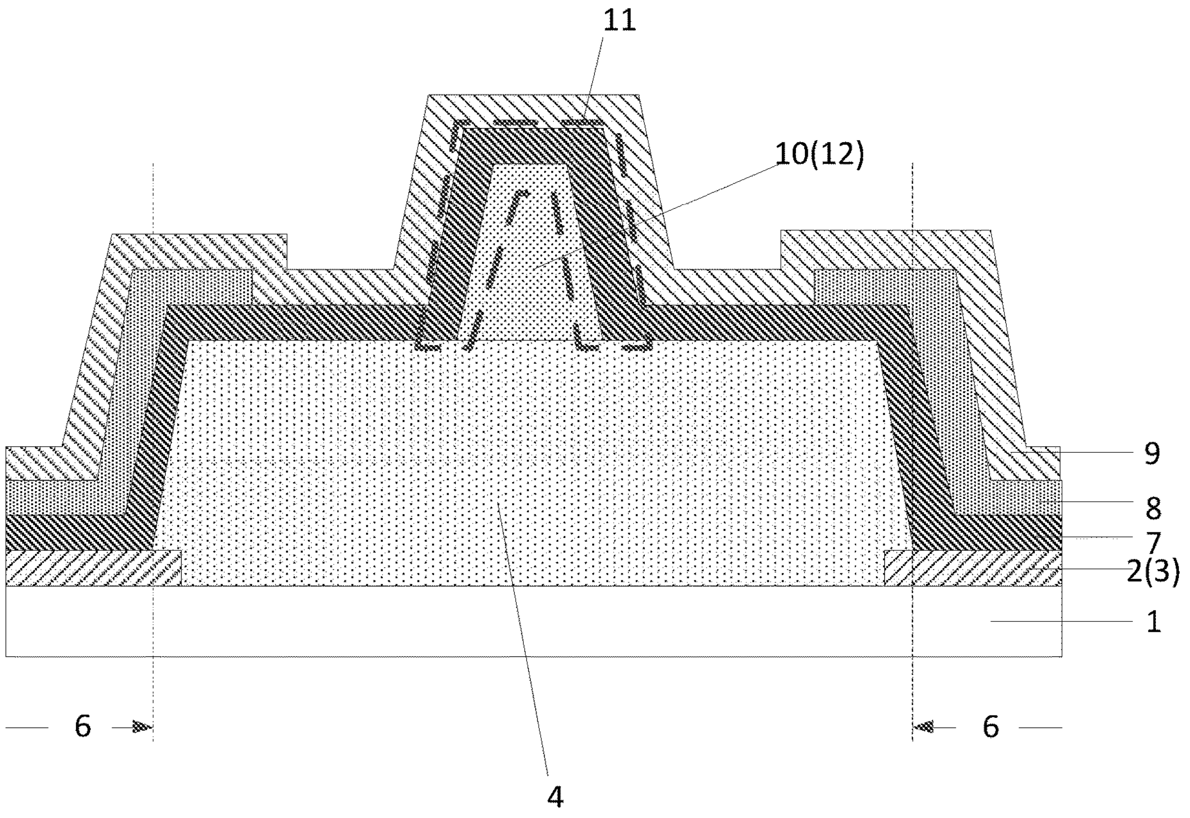
FIG. 1 is a schematic diagram of a structure of a display panel according to an embodiment of the present disclosure.

In order to make objectives, technical solutions and advantages of the embodiments of the present disclosure more clear, the technical solutions of the embodiments of the present disclosure will be clearly and completely described below with reference to the drawings of the embodiments of the present disclosure. Apparently, the described embodiments are a part of the embodiments of the present disclosure, not all of the embodiments. Furthermore, embodiments in the present disclosure and features in the embodiments may be combined with each other if there is no conflict. Based on the described embodiments of the present disclosure, all other embodiments obtained by those of ordinary skills in the art without inventive effort are within the protection scope of the present disclosure.

Unless otherwise defined, technical terms or scientific terms used in the present disclosure should have meanings as commonly understood by those of ordinary skills in the art to which the present disclosure pertains. The “first”, “second” and similar terms used in the present disclosure do not indicate any order, quantity, or importance, but are used only for distinguishing different components. “Include”, “contain”, or a similar word means that elements or objects appearing before the word cover elements or objects listed after the words and their equivalents, but do not exclude other elements or objects. “Connect”, “join”, or a similar term is not limited to a physical or mechanical connection, but may include an electrical connection, whether direct or indirect.

It should be noted that sizes and shapes of various figures in the drawings do not reflect actual scales, and are only for the purpose of schematically illustrating contents of the present disclosure. Moreover, same or similar elements and elements having same or similar functions are denoted by same or similar reference numerals throughout the descriptions.

Figure 2:
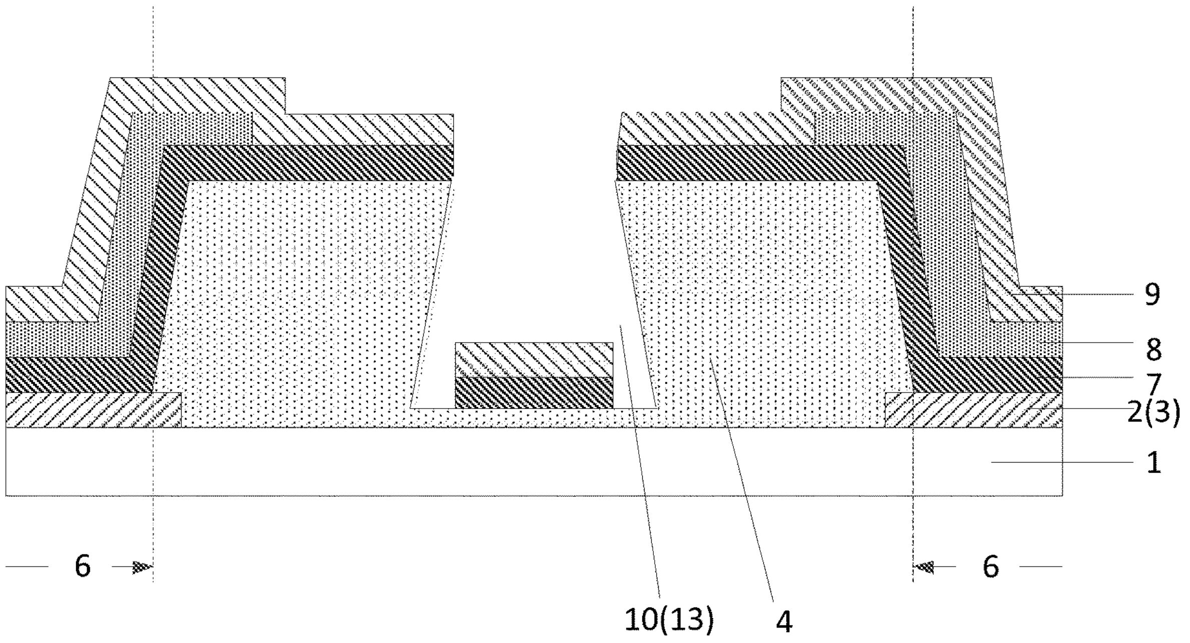
FIG. 2 is a schematic diagram of a structure of another display panel according to an embodiment of the present disclosure.

An embodiment of the present disclosure provides a display panel, as shown in FIG. 1 and FIG. 2. The display panel includes:

- a base substrate 1;
- a first electrode layer 2 located on a side of the base substrate 1 and including multiple first electrodes 3;
- a pixel definition layer 4 located on a side of the first electrode layer 2 facing away from the base substrate 1 and including multiple sub-pixel opening regions 6;
- a common layer 7 located on a side of the first electrode 3 facing away from the base substrate 1 and covering the pixel definition layer 5 for transferring holes or electrons; and
- a second electrode layer 9 located on a side of the common layer 7 facing away from the base substrate 1;

The display panel further includes:

- an extension structure 10 located on a side of the common layer 7 facing the base substrate 1 and between adjacent sub-pixel opening regions 6; the extension structure is configured to increase difficulty of transferring holes or electrons.

In the display panel provided by the embodiment of the present disclosure, the extension structure is provided on the side of the common layer facing the base substrate, so as to increase the difficulty of transferring holes or electrons, such arrangement of the extension structure can reduce or even avoid influence of lateral crosstalk of adjacent sub-pixels, improve a display effect and enhance user experience.

In some embodiments, as shown in FIG. 1 and FIG. 2, the display panel further includes a light emitting layer 8.

In some embodiments, as shown in FIG. 1 and FIG. 2, the common layer 7 is located between the light emitting layer 8 and the first electrode 3.

Apparently, in specific implementation, the common layer may also be located between the light emitting layer and the second electrode layer. Optionally, the common layer is provided between the light emitting layer and the first electrode layer and between the light emitting layer and the second electrode layer.

In specific implementation, the common layer between the light emitting layer and the first electrode layer includes a hole injection layer and/or a hole transport layer; the common layer between the light emitting layer and the second electrode layer includes an electron injection layer and/or an electron transport layer. When the common layer includes a hole injection layer and a hole transport layer, the hole transport layer may be located on a side of the hole injection layer facing away from an anode. When the common layer includes an electron injection layer and an electron transport layer, the electron transport layer is located on a side of the electron injection layer facing away from a cathode layer.

It should be noted that in specific implementation, the display panel can include sub-pixels of different colors, and the sub-pixels of different colors can be provided with light emitting layers with different light emitting colors.

In some embodiments, the extension structure 10 is covered by the common layer 7 and the extension structure 10 at least partially surrounds a sub-pixel opening region 6.

In the display panel provided by the embodiment of the present disclosure, the common layer covers the extension structure, and the extension structure at least surrounds the sub-pixel opening region. Thus, without affecting the design of sub-pixels, a length of the common layer between different sub-pixel opening regions can be increased, so that an inflow path for current of the common layer is prolonged, impedance between sub-pixels is increased, so that the current flowing to the adjacent sub-pixels is reduced, or the common layer can be disconnected in a region corresponding to the extension structure, so that current transmission in the common layer can be blocked. That is to say, the arrangement the extension structure can reduce or even avoid the influence of the lateral crosstalk of adjacent sub-pixels, improve the display effect and enhance the user experience.

In some embodiments, as shown in FIG. 1, the extension structure 10 allows the common layer 7 to have a protrusion structure 11 in the region corresponding to the extension structure 10, or the extension structure 10 allows the common layer 7 to be disconnected in the region corresponding to the extension structure 10, as shown in FIG. 2.

Figure 3:
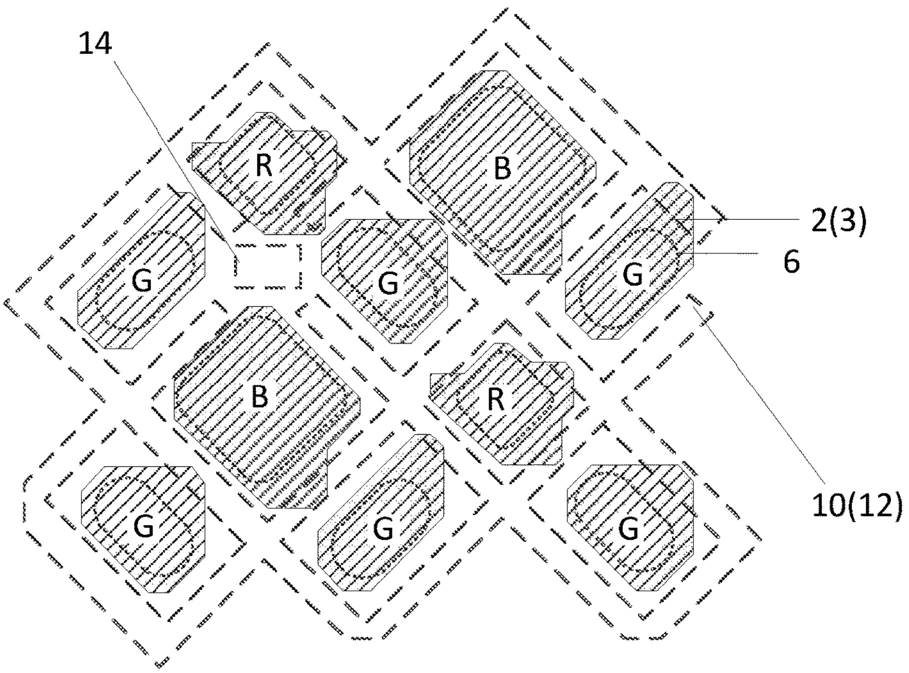
FIG. 3 is a schematic diagram of a structure of another display panel according to an embodiment of the present disclosure.
Figure 4:
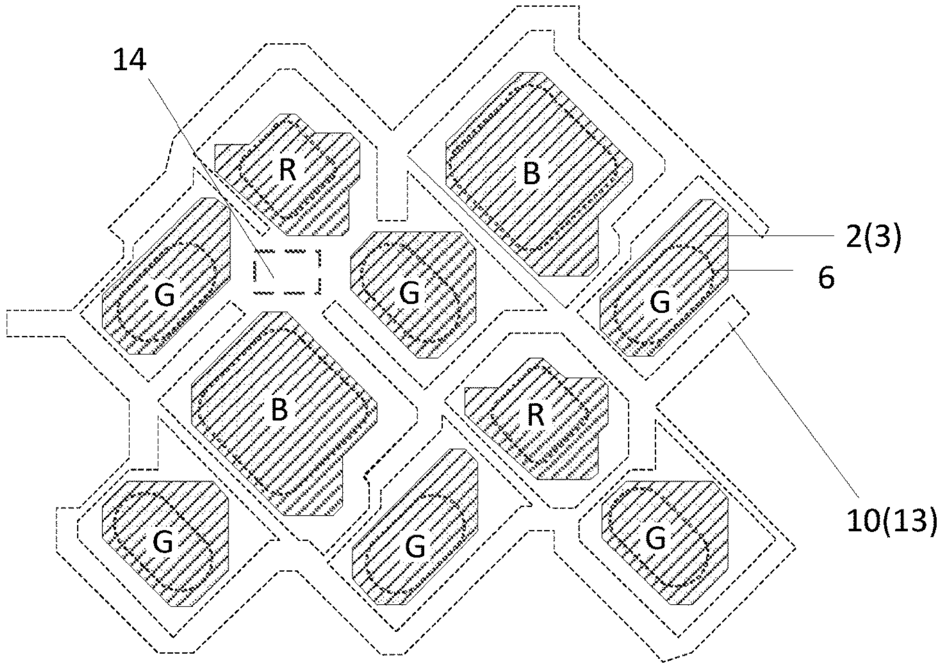
FIG. 4 is a schematic diagram of a structure of another display panel according to an embodiment of the present disclosure.

In some embodiments, as shown in FIG. 3 and FIG. 4, an orthographic projection of the extension structure 10 on the base substrates surrounds the sub-pixel opening region 6.

In some embodiments, as shown in FIG. 3 and FIG. 4, the extension structures 10 surrounding different sub-pixel opening regions 6 are integrally connected.

In some embodiments, as shown in FIG. 3 and FIG. 4, the display panel further includes:

- multiple support parts 14 located between the pixel definition layer and the common layer; an orthographic projection of support parts 14 on the base substrate is not overlapped with an orthographic projection of the extension structures 10 on the base substrate.

It should be noted that in FIG. 3 and FIG. 4, only one support part 14 is shown.

In some embodiments, as shown in FIG. 1 and FIG. 3, the extension structure 10 is an extension part 12 located between the pixel definition layer 4 and the common layer 7.

A distance from a surface of the extension part 12 away from the base substrate 1 to the base substrate 1 is greater than a distance from a surface of the pixel definition layer 4 away from the base substrate 1 to the base substrate 1.

In the display panel provided by the embodiment of the present disclosure, the extension structure includes the extension part provided on the pixel definition layer, so that the common layer covers the extension part and the common layer has the protrusion structure in the region corresponding to the extension structure, and the length of the common layer between different sub-pixel opening regions can be increased, thus prolonging the inflow path for current of the common layer, increasing the impedance between sub-pixels, and reducing the current flowing to the adjacent sub-pixels. The influence of the lateral crosstalk of adjacent sub-pixels can be reduced, and the display effect and the user experience can be improved.

In some embodiments, when the extension structure includes the extension part, a thickness of the support part in a direction perpendicular to the base substrate is greater than a thickness of the extension part.

Or, in some embodiments, as shown in FIG. 2 and FIG. 4, the extension structure is a recessed structure 13 provided on the pixel definition layer 4.

In a direction from the base substrate 1 towards the pixel definition layer 4, a cross-sectional area of the recessed structure 13 gradually decreases.

In the display panel provided by the embodiment of the present disclosure, the extension structure is a recessed structure provided on an isolation part, and the cross-sectional area of the recessed structure gradually decreases in the direction from the base substrate towards the pixel definition layer, i.e. the cross-sectional shape of the recessed structure in the direction perpendicular to the base substrate is trapezoidal, so that when the common layer covers the extension structure, the common layer can be disconnected in the region corresponding to the extension structure, and current transmission in the common layer can be blocked. The influence of the lateral crosstalk of adjacent sub-pixels can be avoided, and the display effect and the user experience can be improved.

In specific implementation, a patterning process can be employed on the isolation part to form the recessed structure. For example, a groove with a rectangular cross-section can be formed first, and then a patterning process is performed on the bottom of the groove to form the recessed structure with a cross-sectional area gradually decreasing in the direction from the base substrate towards the pixel definition layer.

In specific implementation, a depth of the recessed structure is less than a distance between an orthographic projection of the isolation part on a side facing away from the base substrate and the first electrode, so that damage to the first electrode during formation of the recessed structure can be avoided. Or, an orthographic projection of the recessed structure on the base substrate is not overlapped with an orthographic projection of the first electrode on the base substrate, thus there is no restriction on the depth of the recessed structure.

In FIG. 4, the orthographic projection of the recessed structure 13 on the base substrate is not overlapped with the orthographic projection of the first electrode 6 on the base substrate.

It should be noted that in FIGS. 1-4, illustration is made by taking a case in which only one extension structure is included between adjacent sub-pixel opening regions as an example.

Figure 5:
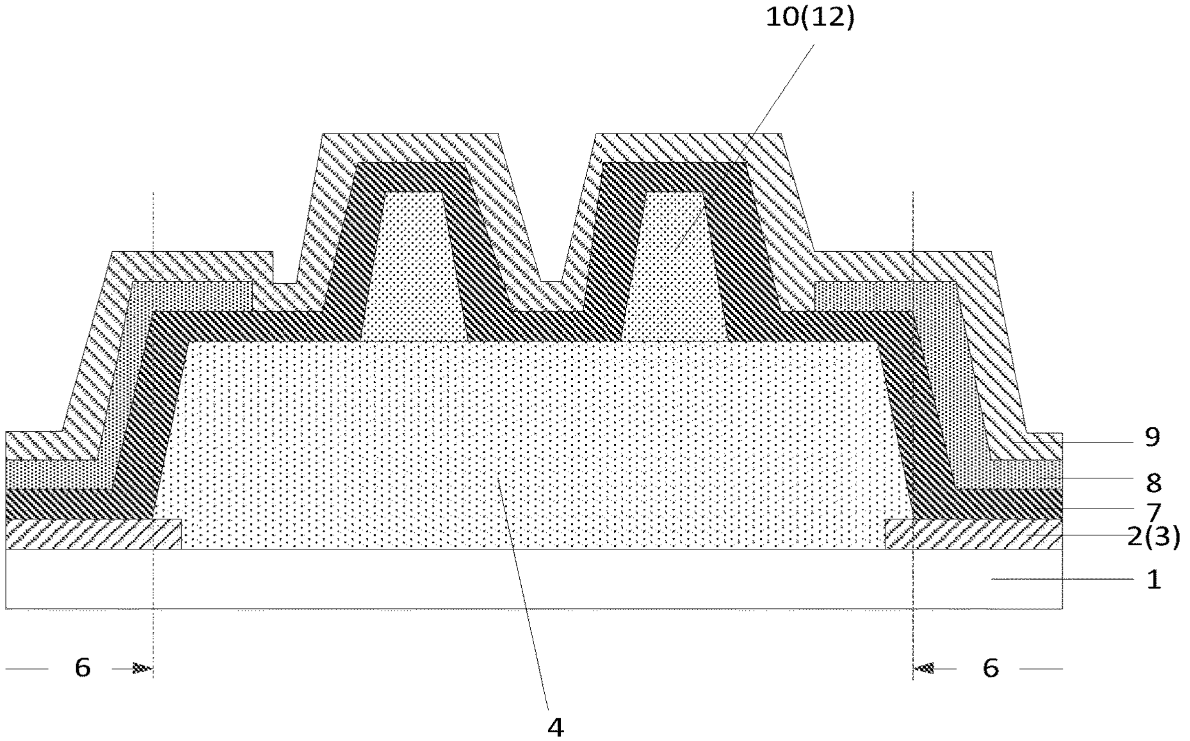
FIG. 5 is a schematic diagram of a structure of another display panel according to an embodiment of the present disclosure.
Figure 6:
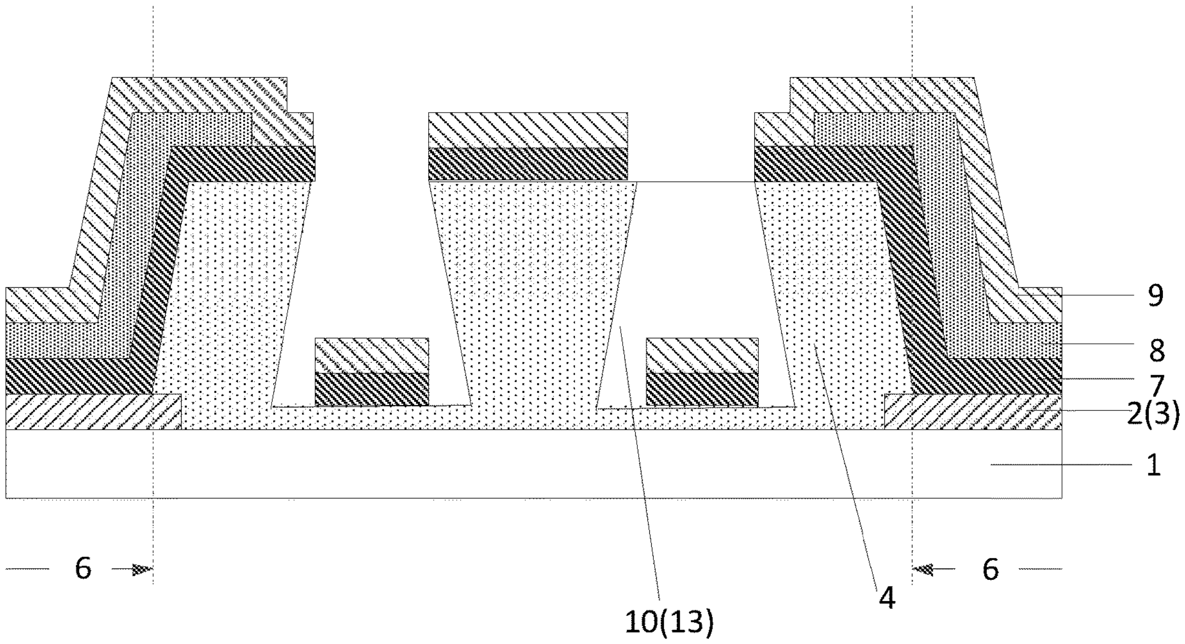
FIG. 6 is a schematic diagram of a structure of another display panel according to an embodiment of the present disclosure.

Apparently, in some embodiments, or also shown in FIG. 5 and FIG. 6, multiple extension structures 10 may also be included between adjacent sub-pixel opening regions 6.

Among them, the extension structure 10 in FIG. 5 includes the extension part 12. That is, multiple extension parts are included between adjacent sub-pixel openings. Therefore, a length of the common layer between different sub-pixel opening regions can be further increased, thereby prolonging the inflow path for current of the common layer, increasing the impedance between sub-pixels, thereby reducing the current flowing to the adjacent sub-pixels. The influence of the lateral crosstalk of adjacent sub-pixels can be reduced, and the display effect and the user experience can be improved.

The extension structure 10 in FIG. 6 includes a recessed structure 13, i.e. multiple recessed structures are included between adjacent sub-pixel openings. The current transmission in the common layer can be blocked. The influence of the lateral crosstalk of adjacent sub-pixels can be avoided, and the display effect and the user experience can be improved.

Figure 7:
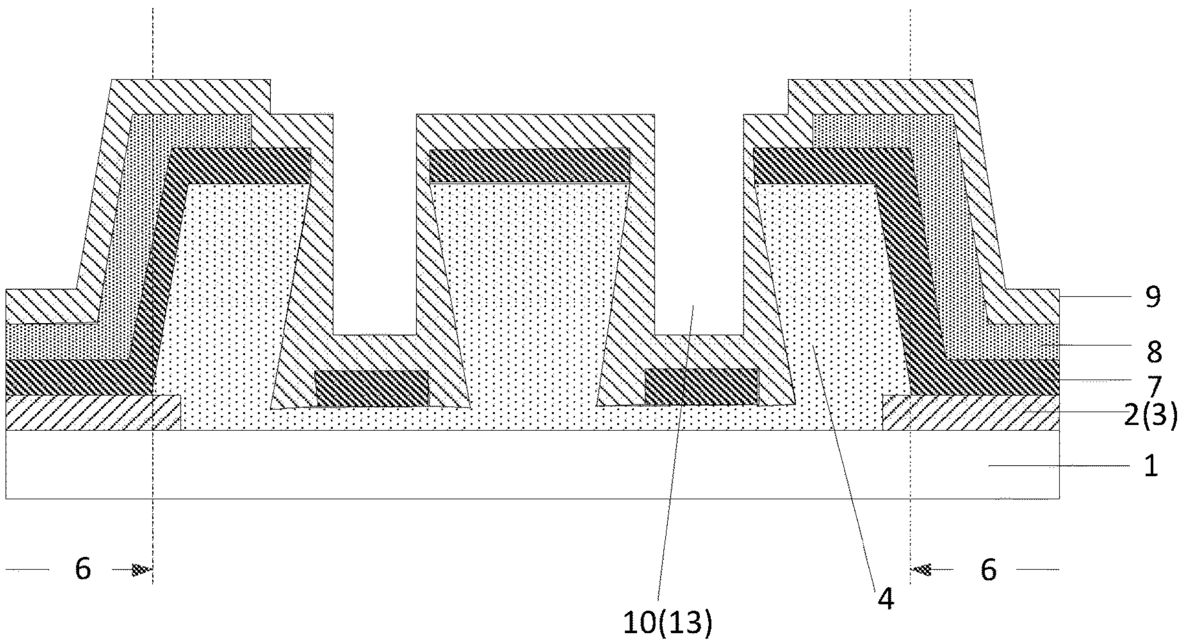
FIG. 7 is a schematic diagram of a structure of another display panel according to an embodiment of the present disclosure.

It should be noted that, in the display panel as shown in FIG. 2 and FIG. 6, a cathode layer 9 is disconnected in the region where the recessed structure 13 is located. Apparently, as shown in FIG. 7, the cathode layer 9 covers a side wall of the recessed structure 13, and the recessed structure 13 is not disconnected in the region where the recessed structure 13 is located.

In some embodiments, as shown in FIG. 8, FIG. 9, FIG. 10, and FIG. 11, multiple sub-pixel opening regions 6 include a first color sub-pixel opening region G, a second color sub-pixel opening region R, and a third color sub-pixel opening region B.

The multiple sub-pixel opening regions 6 are arranged in multiple sub-pixel columns 15. The multiple sub-pixel columns 15 are arranged along a first direction X, each of the multiple sub-pixel columns 15 extends along a second direction Y, wherein the first direction X intersects with the second direction Y.

The multiple sub-pixel columns 15 include multiple first sub-pixel columns 16 and multiple second sub-pixel columns 17 which are provided to be spaced apart from the first sub-pixel columns 16.

In a first sub-pixel column 16, first color sub-pixel opening regions G and second color sub-pixel opening regions R are alternately provided in the second direction Y. In a second sub-pixel column 17, first color sub-pixel opening regions G and third color sub-pixel opening regions B are alternately provided in the second direction Y.

In the first direction X, the second color sub-pixel opening region R is adjacent to the first color sub-pixel opening region G, and the third color sub-pixel opening region B is adjacent to the first color sub-pixel opening region G.

In some embodiments, in the first sub-pixel column 16, a minimum distance h1 between an edge of the first color sub-pixel opening region G and an edge of a side of the first electrode 3 in the second direction Y is greater than a minimum distance h2 between an edge of the first color sub-pixel opening region G and an edge of the first electrode 3 in the first direction X.

In the second sub-pixel column 17, a minimum distance h3 between an edge of the first color sub-pixel opening region G and an edge of the first electrode 3 in the second direction Y is smaller than a minimum distance h4 between an edge of the first color sub-pixel opening region G and an edge of a side of the first electrode 3 in the first direction X.

That is, in the display panel provided by the embodiment of the present disclosure a minimum distance between an edge of the first color sub-pixel opening region and an edge of the first electrode pattern in the arrangement direction of the first color sub-pixel opening region and the second color sub-pixel opening region is reduced, which is equivalent to reducing a side length of the first color sub-pixel opening region in the arrangement direction of the first color sub-pixel opening region and the second color sub-pixel opening region.

In some embodiments, the first color sub-pixel opening region is a green sub-pixel opening region, the second color sub-pixel opening region is a red sub-pixel opening region, and the third color sub-pixel opening region is a blue sub-pixel opening region.

It should be noted that, the first electrode, the common layer, the light emitting layer, and the second electrode layer in the sub-pixel opening region constitute an electroluminescent device. The electroluminescent device may be, for example, an organic light emitting diode (OLED). When an emission signal is turned off, it takes a long time for a screen body to reach a black state due to the existence of capacitance, resulting in slow transient response. When there are many emission signal segments during time of one frame, the screen body can't even reach the black state when each emission signal is turned off. Due to a capacitance of the electroluminescent devices, with the continuous development of display technology, an area of the sub-pixel opening region is increasing, and an influence of capacitance of electroluminescent devices on a phenomenon of slow transient response is becoming more and more serious.

In the display panel provided by the embodiment of the present disclosure, a side length of the first color sub-pixel opening region is reduced in the arrangement direction of the first color sub-pixel opening region and the second color sub-pixel opening region so as to reduce a size of the first color sub-pixel opening region, thereby reducing a capacitance of an electroluminescent diode device formed in the first color sub-pixel opening region. The phenomenon of slow transient response can be improved, and the display effect and the user experience can be improved.

In some embodiments, a difference between a distance between an edge of the first color sub-pixel opening region G and an edge of the third color sub-pixel opening region B in the second sub-pixel column and a distance between an edge of the first color sub-pixel opening region G and an edge of the adjacent second color sub-pixel opening region R in the second sub-pixel column is greater than or equal to 1 micron and less than or equal to 4 microns.

Figure 9:
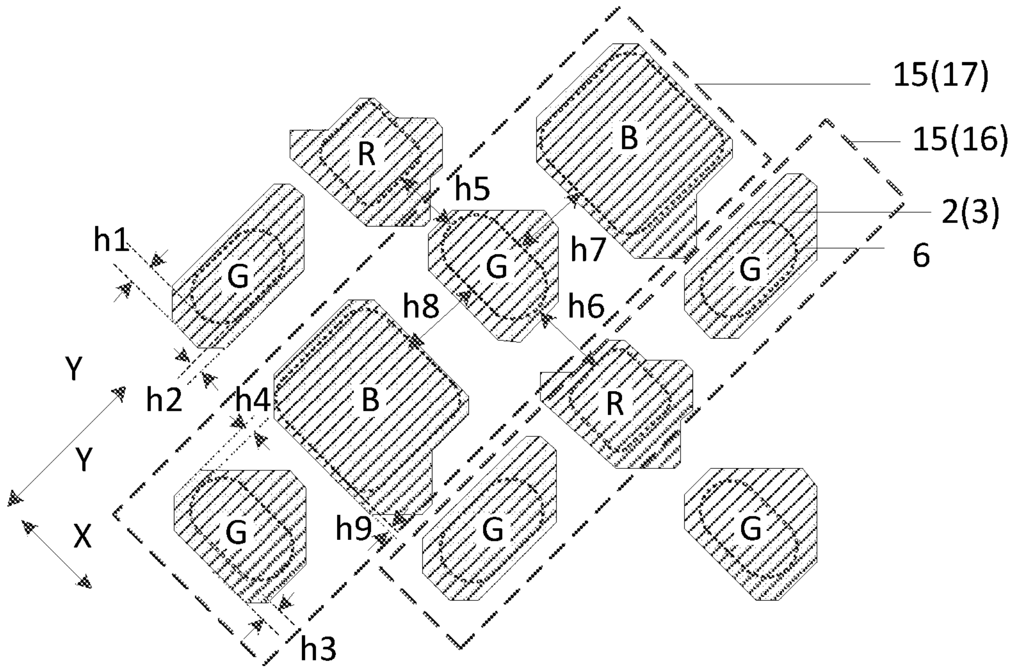
FIG. 9 is a schematic diagram of a structure of another display panel according to an embodiment of the present disclosure.

In some embodiments, as shown in FIG. 9, minimum distances h1, h2, h3, h4 between the edge of the first color sub-pixel opening region G and the edge of the first electrode 3 is greater than a minimum distance h9 between the edge of the third color sub-pixel opening region B and the edge of the first electrode 3.

In the display panel provided by the embodiment of the present disclosure, a minimum distance between the edge of the first color sub-pixel opening region and the edge of the first electrode pattern is reduced in the arrangement direction of the first color sub-pixel opening region and the third color sub-pixel opening region, which is equivalent to reducing the side length of the first color sub-pixel opening region in the arrangement direction of the first color sub-pixel opening region and the third color sub-pixel opening region. Thus, an area of the first color sub-pixel opening region can be further reduced.

Figure 8:
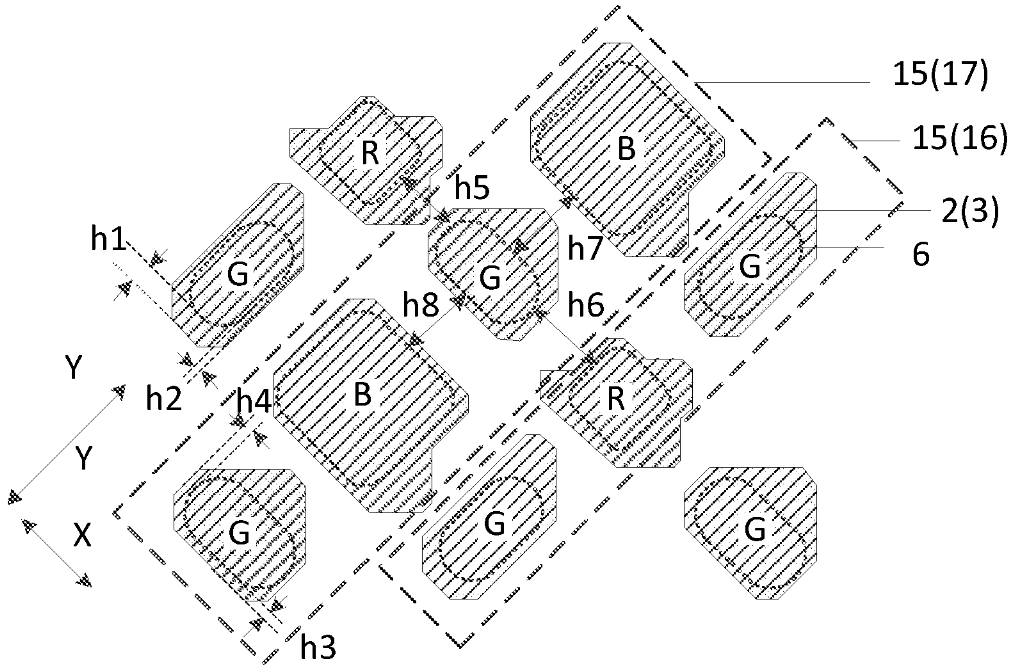
FIG. 8 is a schematic diagram of a structure of another display panel according to an embodiment of the present disclosure.

In some embodiments, as shown in FIG. 8 and FIG. 9, a minimum distance h7 between an edge of the first color sub-pixel opening region G and an edge of an adjacent third color sub-pixel opening region B is equal to a minimum distance h8 between an edge of the first color sub-pixel opening region G and an edge of another adjacent third color sub-pixel opening region B. A minimum distance h5 between an edge of the first color sub-pixel opening region G and an edge of an adjacent second color sub-pixel opening region R is equal to a minimum distance h6 between an edge of the first color sub-pixel opening region G and an edge of another adjacent second color sub-pixel opening region R.

Figure 10:
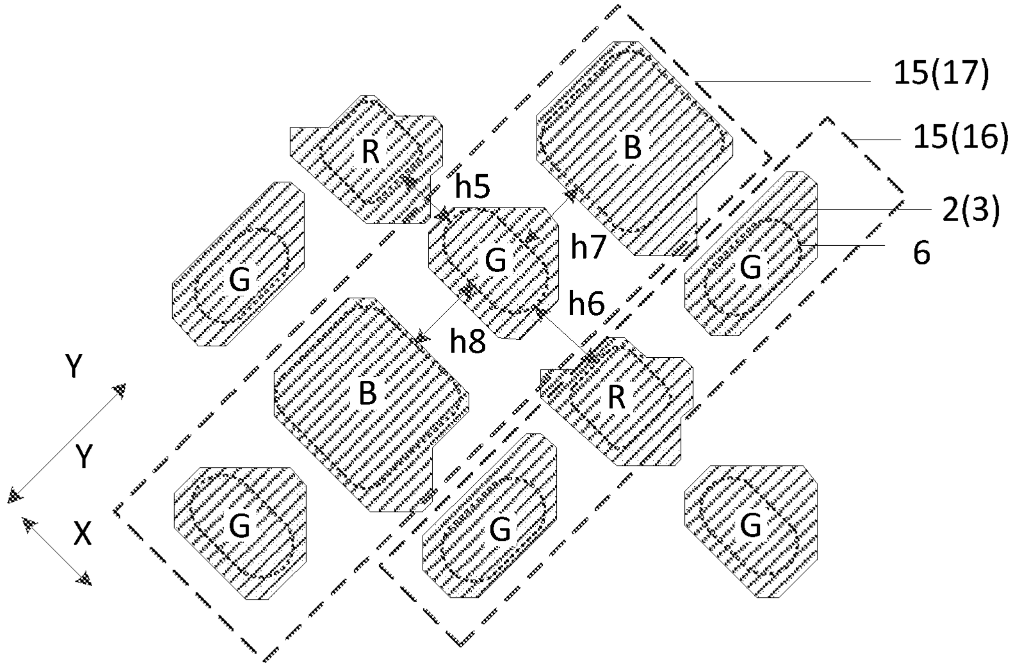
FIG. 10 is a schematic diagram of a structure of another display panel according to an embodiment of the present disclosure.

Or, in some embodiments, as shown in FIG. 10, the minimum distance h8 between the edge of the first color sub-pixel opening region G and the edge of the adjacent third color sub-pixel opening region B is greater than the minimum distance h7 between the edge of the first color sub-pixel opening region G and the edge of another adjacent third color sub-pixel opening region B.

In some embodiments, as shown in FIG. 10, the minimum distance h6 between the edge of the first color sub-pixel opening region G and the edge of the adjacent second color sub-pixel opening region R is greater than the minimum distance h5 between the edge of the first color sub-pixel opening region G and the edge of another adjacent second color sub-pixel opening region R.

That is, in the display panel shown in FIG. 10 provided by the embodiment of the present disclosure, only two sides of each first color sub-pixel opening region are inwardly contracted to reduce an area of the first color sub-pixel opening region.

Figure 11:
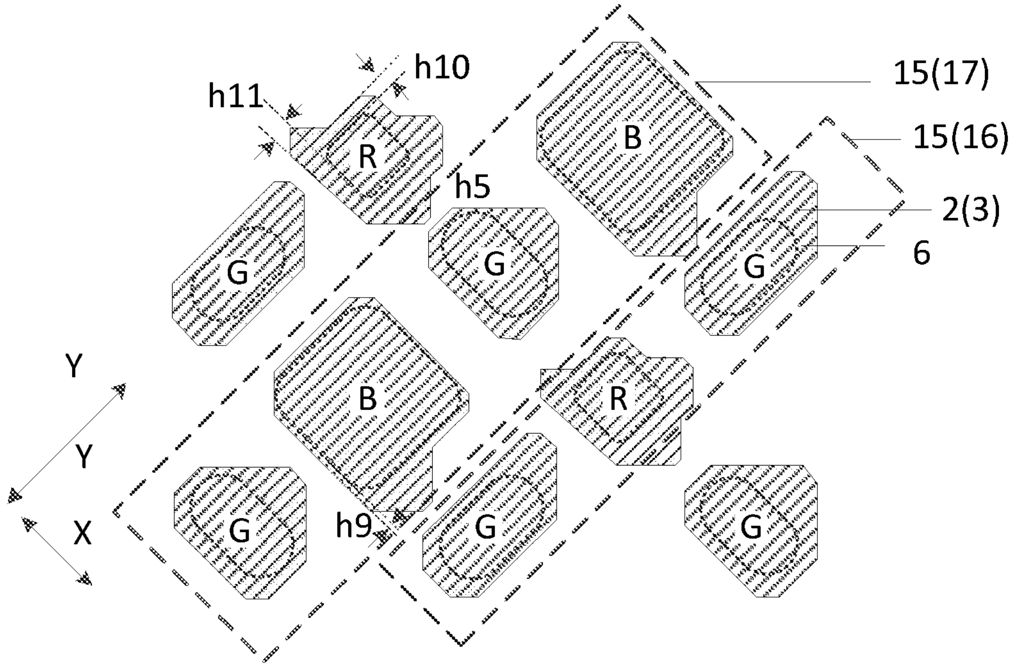
FIG. 11 is a schematic diagram of a structure of another display panel according to an embodiment of the present disclosure.

In some embodiments, as shown in FIG. 11, a minimum distance h10, h11 between an edge of the second color sub-pixel opening region R and an edge of the first electrode 3 is greater than the minimum distance h9 between the edge of the third color sub-pixel opening region B and the edge of the first electrode 3.

In the display panel provided by the embodiment of the present disclosure, the minimum distance between the edge of the second color sub-pixel opening region and the edge of the first electrode is greater than the minimum distance between the edge of the third color sub-pixel opening region and the edge of the first electrode, that is, the distance between the edge of the second color sub-pixel opening region and the edge of the first electrode is increased, so that a size of the second color sub-pixel opening region can be reduced, and a capacitance of an electroluminescent diode device formed in the second color sub-pixel opening region can be reduced. The phenomenon of slow transient response can be improved, and the display effect and the user experience can be improved.

Figure 12:
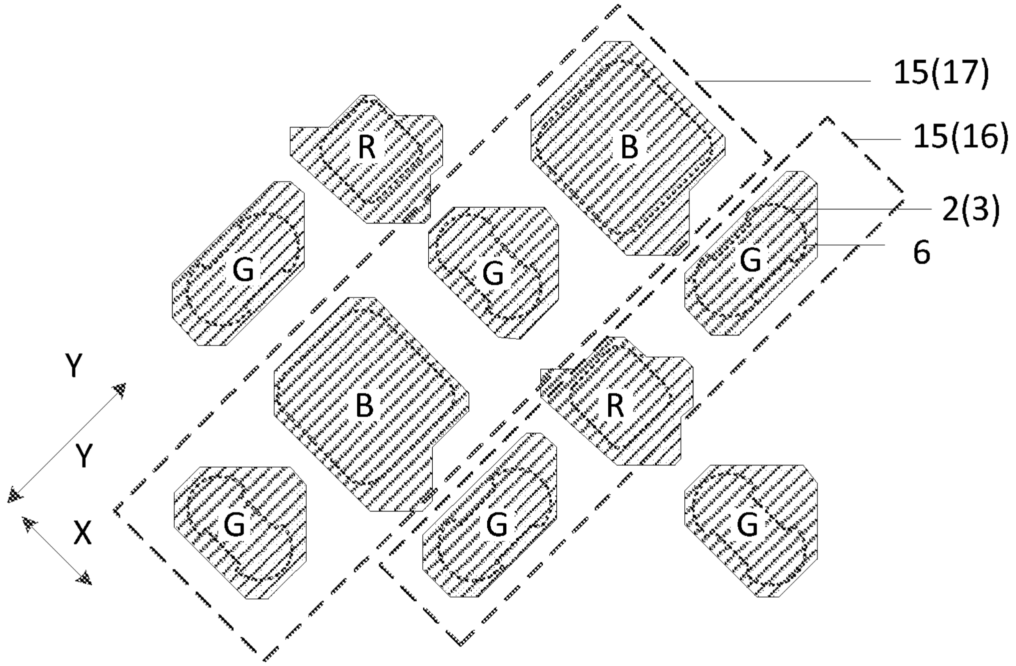
FIG. 12 is a schematic diagram of a structure of another display panel according to an embodiment of the present disclosure.

In some embodiments, as shown in FIG. 12, an edge of a side of the first color sub-pixel opening region G close to the third color sub-pixel opening region B is recessed toward the first color sub-pixel opening region G.

In some embodiments, an area of a first color sub-pixel opening region located in the first sub-pixel column is equal to an area of a first color sub-pixel opening region located in the second sub-pixel column.

In some embodiments, a pixel drive circuit layer is further included between the base substrate and the first electrode layer. The pixel drive circuit layer includes multiple pixel drive circuits corresponding to sub-pixels.

Figure 13:
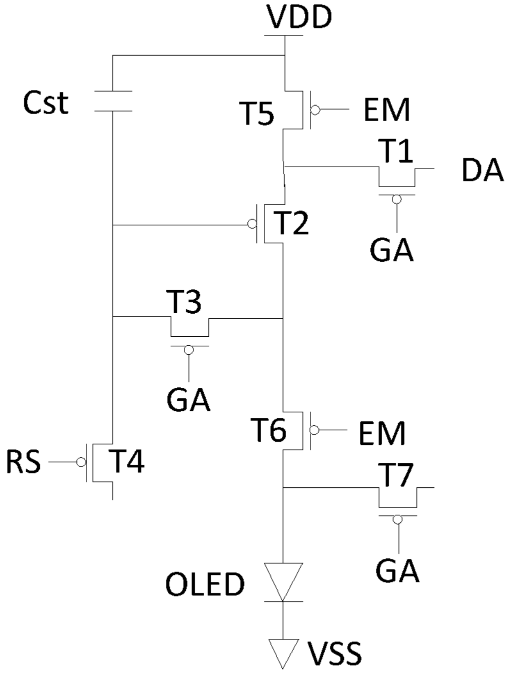
FIG. 13 is a schematic diagram of a pixel drive circuit of a display panel according to an embodiment of the present disclosure.
Figure 14:
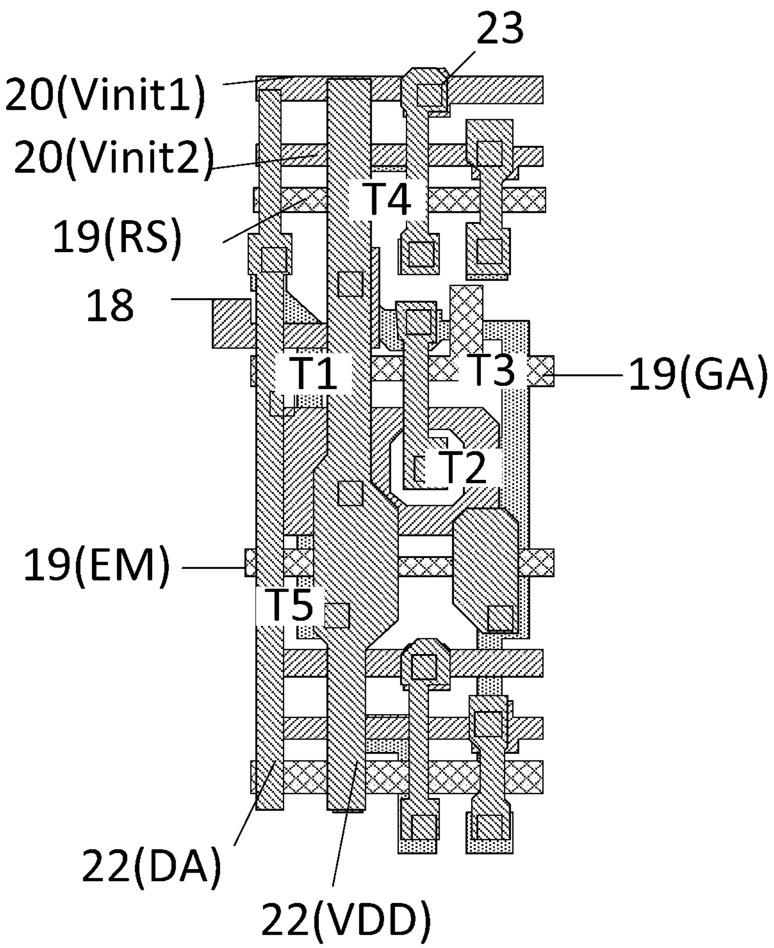
FIG. 14 is an arrangement diagram of film layers of a pixel drive circuit of a display panel according to an embodiment of the present disclosure.
Figure 15:
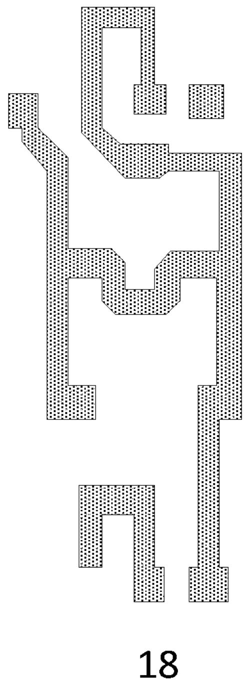
FIG. 15 is a schematic diagram of a structure of an active layer of a display panel according to an embodiment of the present disclosure.
Figure 16:
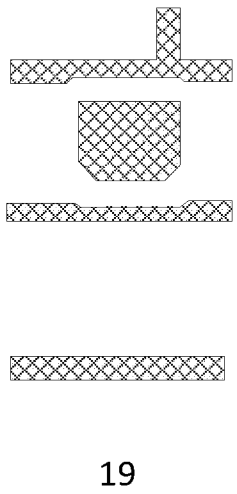
FIG. 16 is a schematic diagram of a structure of a first gate electrode layer of a display panel according to an embodiment of the present disclosure.
Figure 17:
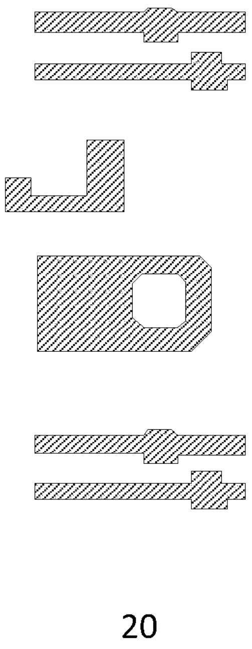
FIG. 17 is a schematic diagram of a structure of a second gate electrode layer of a display panel according to an embodiment of the present disclosure.
Figure 18:
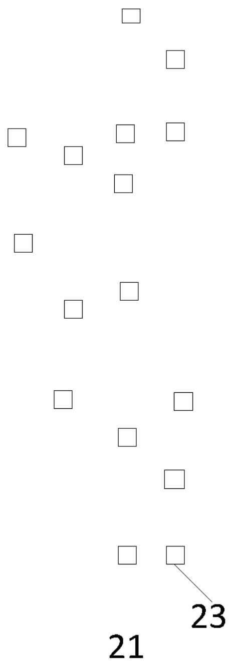
FIG. 18 is a schematic diagram of a structure of an interlayer insulation layer of a display panel according to an embodiment of the present disclosure.
Figure 19:
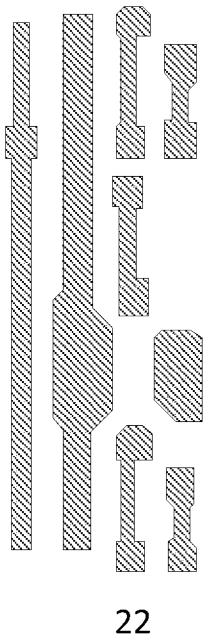
FIG. 19 is a schematic diagram of a structure of a source-drain electrode layer of a display substrate according to an embodiment of the present disclosure.

As shown in FIG. 13, the pixel drive circuit includes a first transistor T2, a second transistor T2, a third transistor T3, a fourth transistor T4, a fifth transistor T5, a sixth transistor T6, a seventh transistor T7, and a first capacitor Cst. Among them, a control electrode of the first transistor T2, a control electrode of the third transistor T3, and a control electrode of the seventh transistor T7 are all electrically connected to a scan signal line GA. A first electrode of the first transistor T2 is electrically connected to a data signal line, and a second electrode of the first transistor T2 is electrically connected to a second electrode of the second transistor T2 and a second electrode of the fifth transistor T5. A control electrode of the second transistor T2 is electrically connected to a first plate of the first capacitor Cst, and the first electrode of the second transistor T2 is electrically connected to a second electrode of the third transistor T3 and a first electrode of the sixth transistor T6. A first electrode of the third transistor T3 is electrically connected to a second electrode of the fourth transistor T4 and the first electrode of the first capacitor Cst. A control electrode of the fourth transistor T4 is electrically connected to a reset signal line RS, and a first electrode of the fourth transistor T4 is electrically connected to a first initialization signal line Vinit1. Both a control electrode of the fifth transistor T5 and a control electrode of the sixth transistor T6 are electrically connected to a light emitting control signal line EM. A second electrode of the sixth transistor T6 and a second electrode of the seventh transistor T7 are electrically connected to a first electrode of an electroluminescent device OLED. A first electrode of the seventh transistor T7 is electrically connected to a second initialization signal line Vinit2. A first electrode of the fifth transistor T5 and a second plate of the first capacitor Cst are electrically connected to a power supply signal line VDD.

In specific implementation, each transistor may be, for example, a thin film transistor. The control electrode of a transistor is a gate of the thin film transistor, and a first electrode and a second electrode of each transistor are respectively a source electrode and a drain electrode of the thin film transistor.

Figure 20:
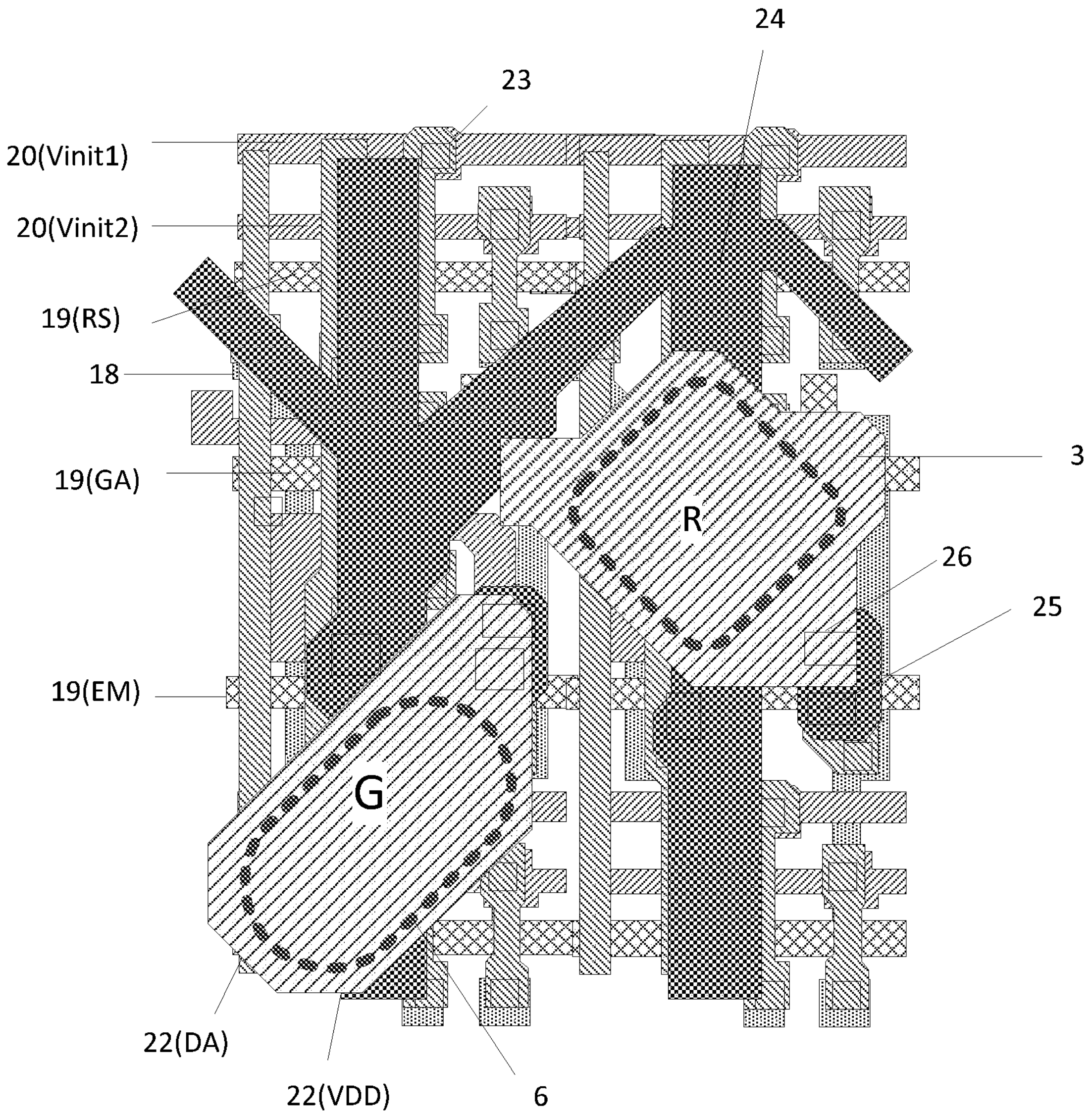
FIG. 20 is a schematic diagram of a structure of another display panel according to an embodiment of the present disclosure.

In some embodiments, as shown in FIGS. 13 to 19, the pixel drive circuit includes an active layer 18, a first gate insulation layer (not shown), a first gate electrode layer 19, a second gate insulation layer (not shown), a second gate electrode layer 20, an interlayer insulation layer 21, and a source-drain electrode layer 22 that are sequentially formed on the base substrate. Among them, FIGS. 14 to 19 show patterns of the active layer 18, the first gate electrode layer 19, the second gate electrode layer 20, the interlayer insulation layer 21, and the source-drain layer 22, respectively. Only a region of a via 23 of the interlayer insulation layer 21 is shown in FIG. 20. The source-drain electrode layer 22 is electrically connected to the second gate electrode layer 20 through the via 23.

In specific implementation, the active layer includes a channel region of each transistor and a contact region for source and drain electrodes. The first gate electrode layer includes, for example, a scan line GA, a light emitting control signal line EM, and a reset signal line RS. The second gate electrode layer includes, for example, a first initialization signal line Vinit1, a second initialization signal line Vinit2, a gate of each transistor, and a second electrode of the first capacitor Cst. The source-drain electrode layer includes, for example, a source electrode and a drain electrode of each transistor, a data line DA, and a power supply signal line VDD.

Figure 21:
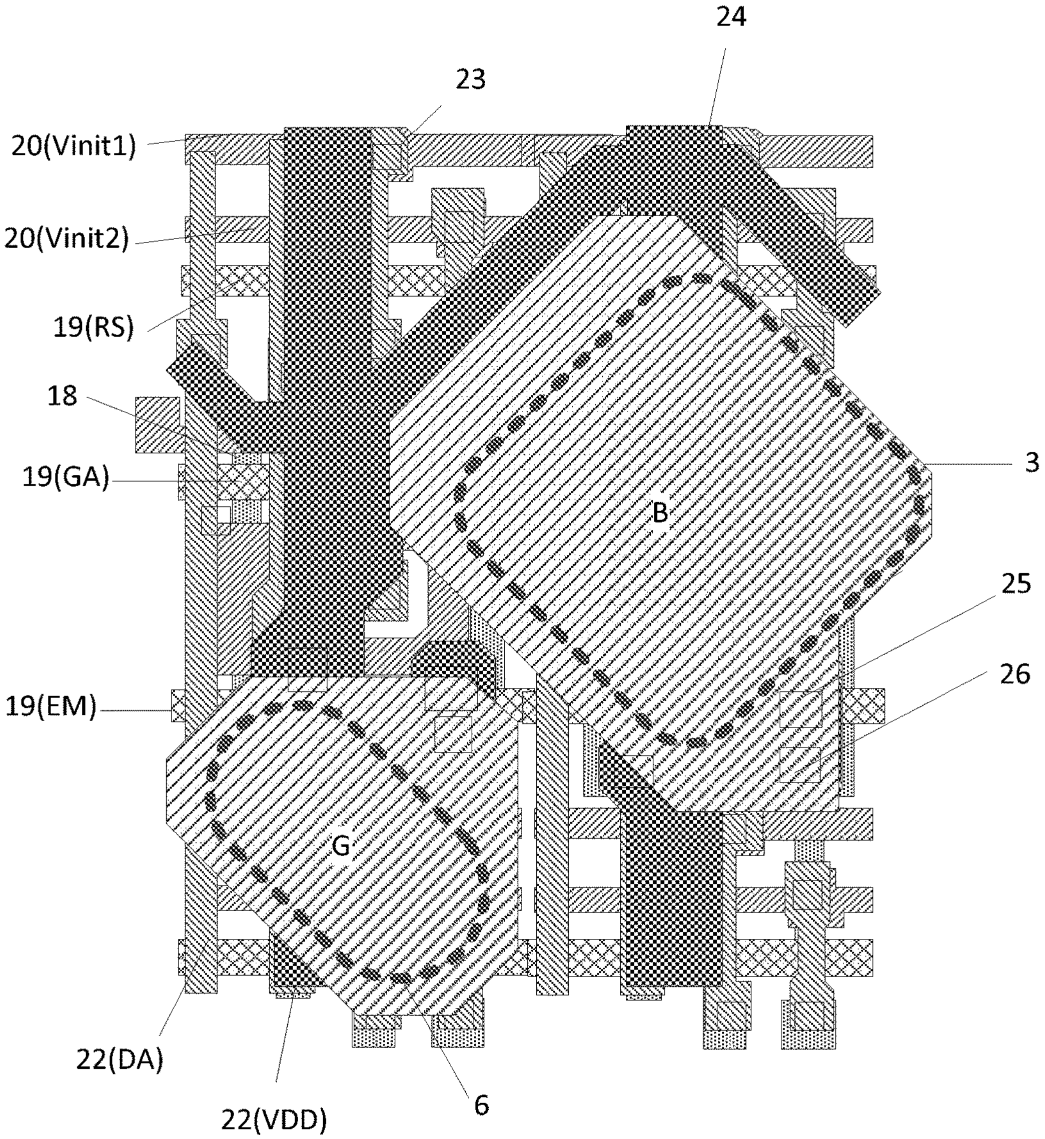
FIG. 21 is a schematic diagram of a structure of another display panel according to an embodiment of the present disclosure.
Figure 22:
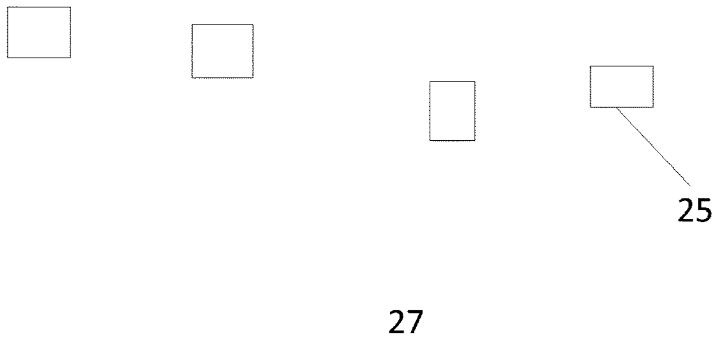
FIG. 22 is a schematic diagram of a structure of a first planarization layer of a display panel according to an embodiment of the present disclosure.
Figure 23:
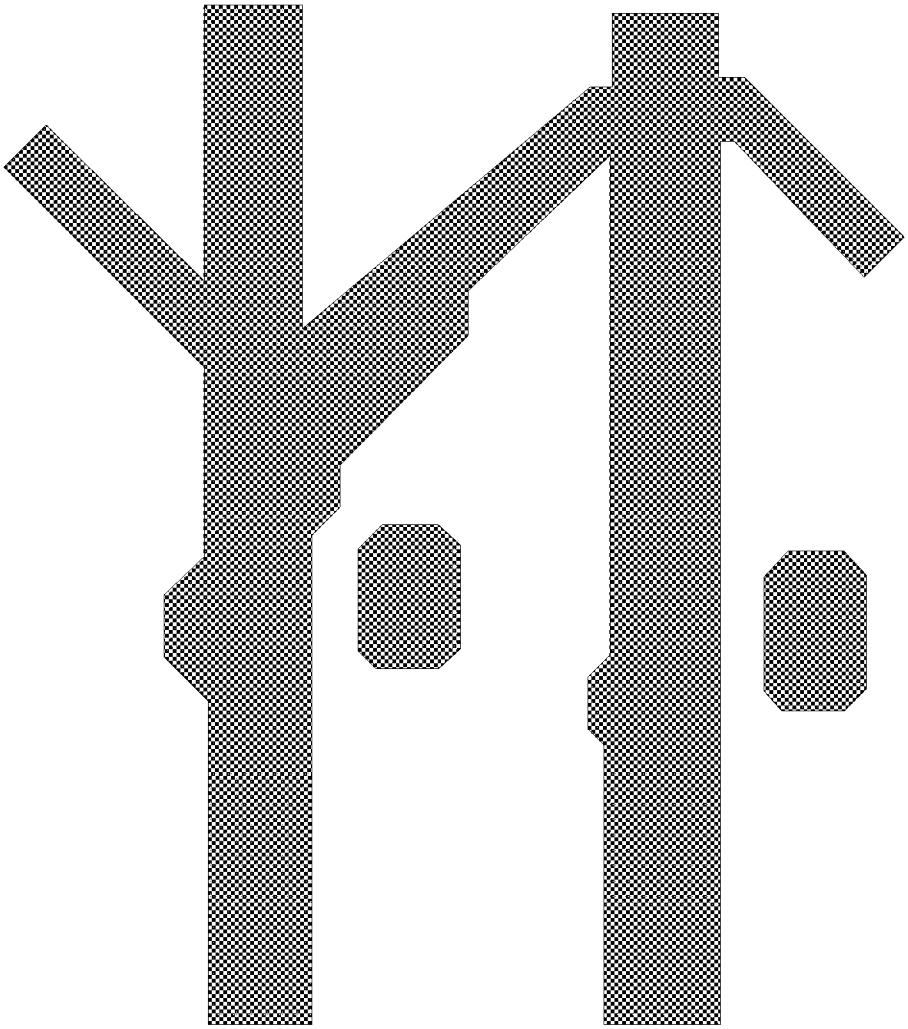
FIG. 23 is a schematic diagram of a structure of a connection electrode layer of a display panel according to an embodiment of the present disclosure.
Figure 24:
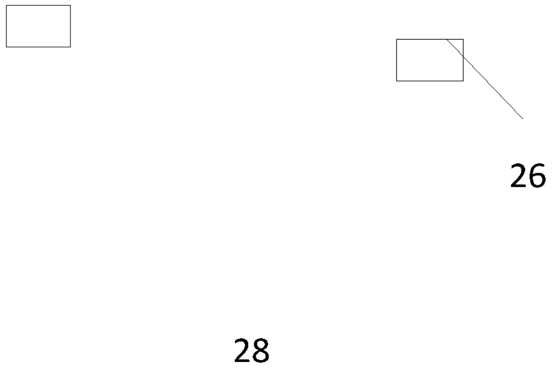
FIG. 24 is a schematic diagram of a structure of a second planarization layer of a display panel according to an embodiment of the present disclosure.
Figure 25:
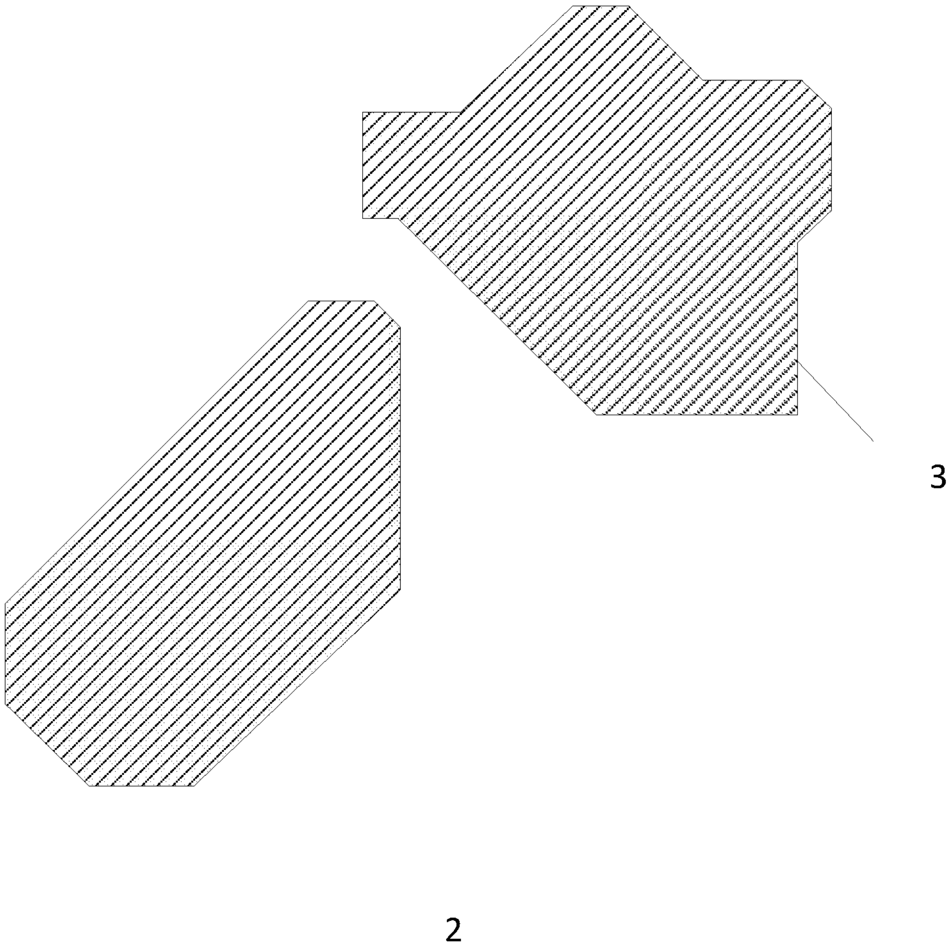
FIG. 25 is a schematic diagram of a structure of a first electrode layer of a display panel according to an embodiment of the present disclosure.
Figure 26:
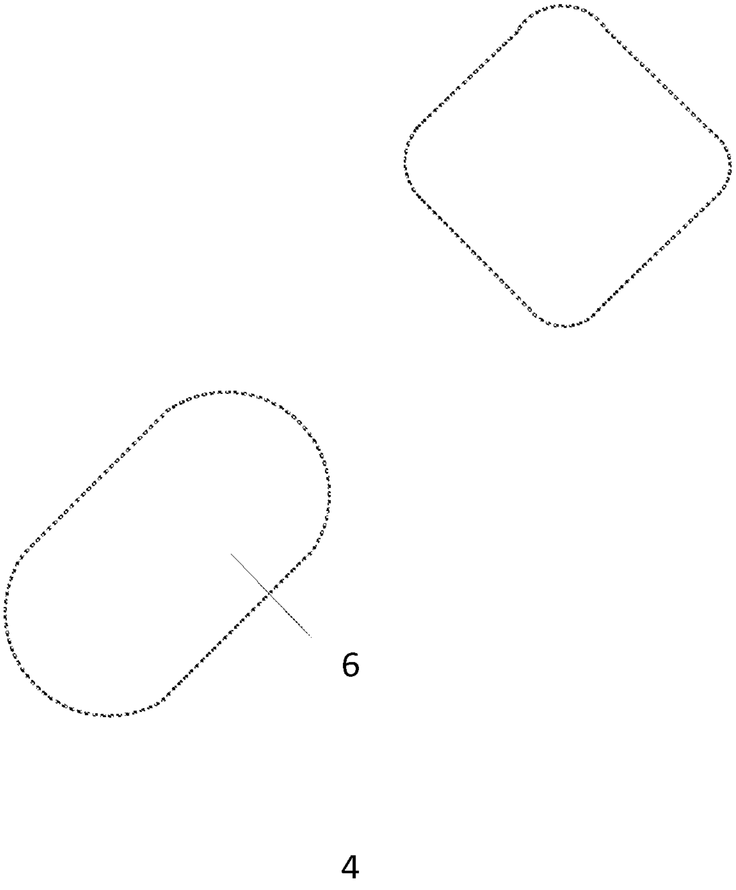
FIG. 26 is a schematic diagram of a structure of a pixel definition layer of a display panel according to an embodiment of the present disclosure.
Figure 27:
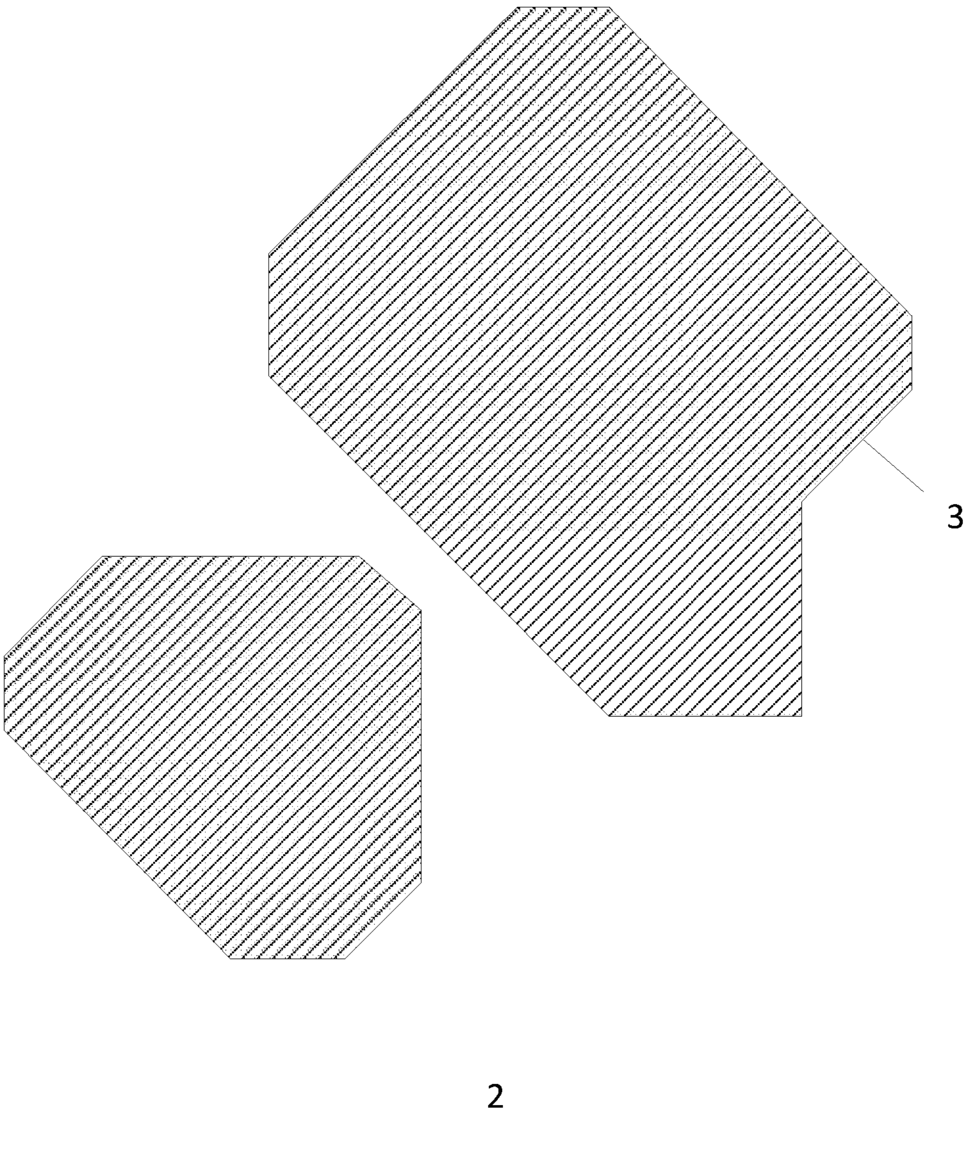
FIG. 27 is a schematic diagram of a structure of a first electrode layer of another display panel according to an embodiment of the present disclosure.
Figure 28:
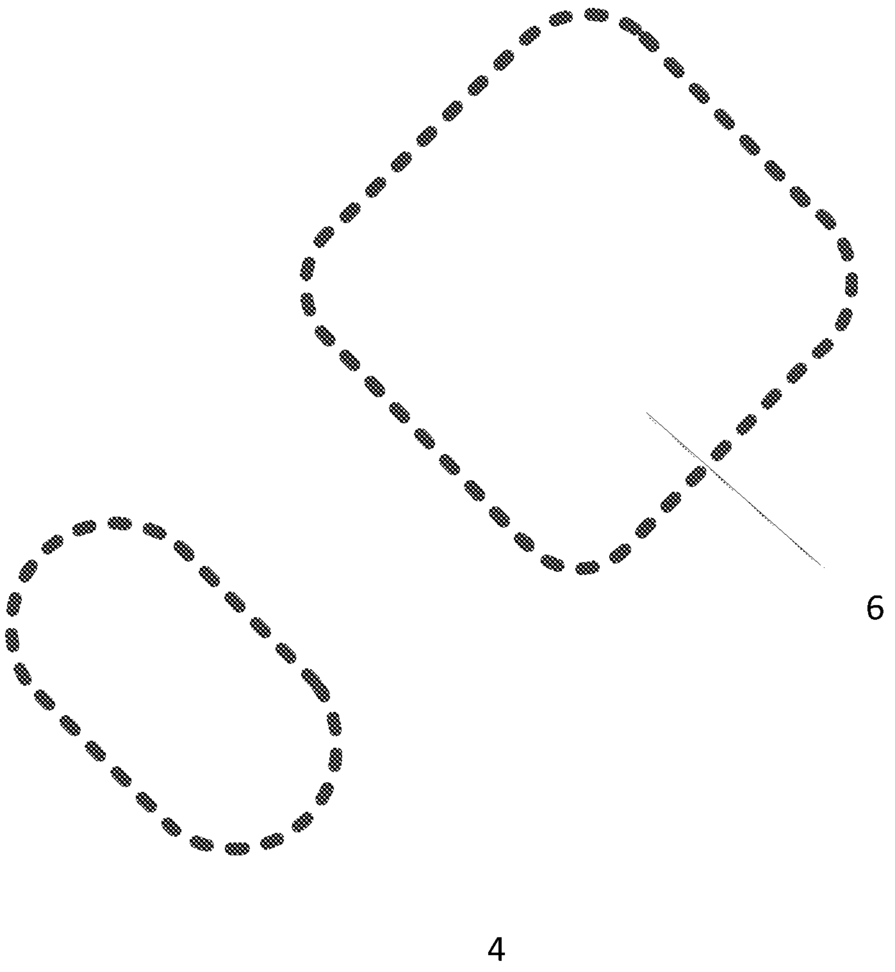
FIG. 28 is a schematic diagram of a pixel definition layer of another display panel according to an embodiment of the present disclosure.

In specific implementation, between the first electrode and the source-drain electrode layer, the pixel drive circuit further includes a first planarization layer, a connection electrode layer and a second planarization layer. The connection electrode layer includes a connection electrode that electrically connects the first electrode to the source-drain electrode layer. A pixel layout corresponding to a pixel column including first color sub-pixels and second color sub-pixels is shown in FIG. 20, and a pixel layout corresponding to a pixel column including first color sub-pixels and third color sub-pixels is shown in FIG. 21. FIG. 22, FIG. 23, and FIG. 24 are patterns of a first planarization layer 27, a connection electrode layer 24, and a second planarization layer 28, respectively. Among them, FIG. 23 shows only a pattern of a via 25 of the first planarization layer 27. Among them, FIG. 25 shows only a pattern of a via 26 of the second planarization layer 28. A pattern of the first electrode layer 2 corresponding to a pixel column including first color sub-pixels and second color sub-pixels and a pattern of a sub-pixel opening region 6 of the pixel definition layer 4 are shown in FIG. 25 and FIG. 26, respectively. A pattern of the first electrode layer 2 corresponding to a pixel column including first color sub-pixels and third color sub-pixels and a pattern of a sub-pixel opening region 6 of the pixel definition layer 4 are shown in FIG. 27 and FIG. 28, respectively.

An embodiment of the present disclosure provides a display apparatus, including a display panel provided by an embodiment of the present disclosure.

The display apparatus provided by an embodiment of the present disclosure is any product or component with a display function, such as a mobile phone, a tablet computer, a television, a display, a laptop computer, a digital photo frame, and a navigator. Other essential components included in the display apparatus which should be understood to be included in the display apparatus by those of ordinary skills in the art will not be described repeatedly herein, and should not be taken as a limitation on the present disclosure. An implementation of the display device can refer to an embodiment of the display panel described above and the repetitive parts will not be repeated.

In summary, in the display panel and the display apparatus provided in the embodiments of the present disclosure, the extension structure is provided on a side of the common layer facing the base substrate, and the common layer covers the extension structure. When the common layer covers the extension structure and the common layer has a protrusion structure in a region corresponding to the extension structure, which is equivalent to making the common layer form a curved non-planar shape in regions between different sub-pixel opening regions. Under the condition of not affecting the design of sub-pixels, the length of the common layer between the different sub-pixel opening regions can be increased, thereby prolonging the inflow path for current of the common layer, increasing the impedance between sub-pixels and reducing the current flowing to the adjacent sub-pixels. The common layer covers the extension structure and when the common layer is disconnected in the region corresponding to the extension structure, current transmission in the common layer can be blocked. That is, the arrangement of the extension structure can reduce or even avoid the influence of the lateral crosstalk of adjacent sub-pixels, improve the display effect and enhance the user experience.

Apparently, various modifications and variations to the present disclosure may be made by those skilled in the art without departing from the spirit and scope of the present disclosure. Thus, if these modifications and variations to the present disclosure fall within the scope of the claims of the present disclosure and their equivalent techniques, the present disclosure is intended to include these modifications and variations.

The invention claimed is:

1. A display panel, comprising:

a base substrate;

a first electrode layer located on a side of the base substrate and comprising a plurality of first electrodes;

a pixel definition layer located on a side of the first electrode layer facing away from the base substrate and comprising a plurality of sub-pixel opening regions;

a common layer located on a side of the first electrode facing away from the base substrate and covering the pixel definition layer for transferring holes or electrons;

a second electrode layer located on a side of the common layer facing away from the base substrate;

the display panel further comprises:

an extension structure located between the common layer and the base substrate, and between adjacent sub-pixel opening regions; the extension structure is configured to increase a difficulty in transferring the holes or the electrons, wherein the display panel further comprises: a plurality of support parts located between the pixel definition layer and the common layer; an orthographic projection of the support parts on the base substrate is not overlapped with an orthographic projection of the extension structure on the base substrate.

2. The display panel according to claim 1, wherein the extension structure is covered by the common layer, the extension structure at least partially surrounds a sub-pixel opening region.

3. The display panel according to claim 2, wherein extension structures surrounding different sub-pixel opening regions are integrally connected.

4. The display panel according to claim 1, wherein the extension structure is an extension part located between the pixel definition layer and the common layer;

a distance between a surface of the extension part away from the base substrate and the base substrate is greater than a distance between a surface of the pixel definition layer away from the base substrate and the base substrate.

5. The display panel according to claim 4, wherein extension structures surrounding different sub-pixel opening regions are integrally connected.

6. The display panel according to claim 1, wherein the extension structure is a recessed structure provided on the pixel definition layer;

in a direction from the base substrate towards the pixel definition layer, a cross-sectional area of the recessed structure gradually decreases.

7. The display panel according to claim 6, wherein extension structures surrounding different sub-pixel opening regions are integrally connected.

8. The display panel according to claim 1, wherein extension structures surrounding different sub-pixel opening regions are integrally connected.

9. The display panel according to claim 1, wherein a plurality of extension structures are comprised between adjacent sub-pixel opening regions.

10. The display panel according to claim 9, wherein when the extension structure comprises an extension part, a thickness of the support parts in a direction perpendicular to the base substrate is greater than a thickness of the extension part.

11. The display panel according to claim 1, wherein the plurality of sub-pixel opening regions comprise: first color sub-pixel opening regions, second color sub-pixel opening regions, and third color sub-pixel opening regions;

the plurality of sub-pixel opening regions are arranged into a plurality of sub-pixel columns; the plurality of sub-pixel columns are arranged in a first direction, each of the sub-pixel columns extends in a second direction, and the first direction intersects with the second direction;

the plurality of sub-pixel columns comprises: a plurality of first sub-pixel columns and second sub-pixel columns provided to be spaced apart from the first sub-pixel columns;

in each first sub-pixel column, first color sub-pixel opening regions and second color sub-pixel opening regions are alternately provided along the second direction; in each second sub-pixel column, first color sub-pixel opening regions and third color sub-pixel opening regions are alternately provided along the second direction;

in the first direction, each second color sub-pixel opening region is adjacent to a first color sub-pixel opening region, and each third color sub-pixel opening region is adjacent to a first color sub-pixel opening region;

in the first sub-pixel column, a minimum distance between an edge of a first color sub-pixel opening region and an edge of a side of a first electrode in the second direction is greater than a minimum distance between an edge of the first color sub-pixel opening region and an edge of the first electrode in the first direction; and in the second sub-pixel column, a minimum distance between an edge of a first color sub-pixel opening region and an edge of a first electrode in the first direction is smaller than a minimum distance between an edge of the first color sub-pixel opening region and an edge of a side of the first electrode in the second direction.

12. The display panel according to claim 11, wherein a minimum distance between an edge of the first color sub-pixel opening region and an edge of the first electrode is greater than a minimum distance between an edge of the third color sub-pixel opening region and an edge of the first electrode.

13. The display panel according to claim 12, wherein a minimum distance between an edge of a first color sub-pixel opening region and an edge of an adjacent third color sub-pixel opening region is greater than a minimum distance between an edge of the first color sub-pixel opening region and an edge of another adjacent third color sub-pixel opening region.

14. The display panel according to claim 11, wherein a minimum distance between an edge of a first color sub-pixel opening region and an edge of an adjacent second color sub-pixel opening region is greater than a minimum distance between an edge of the first color sub-pixel opening region and an edge of another adjacent second color sub-pixel opening region.

15. The display panel according to claim 11, wherein a minimum distance between an edge of a second color sub-pixel opening region and an edge of a first electrode is greater than a minimum distance between an edge of a third color sub-pixel opening region and an edge of the first electrode.

16. The display panel according to claim 11, wherein an edge of a side of the first color sub-pixel opening region close to a second color sub-pixel opening region is recessed toward the first color sub-pixel opening region.

17. A display apparatus, comprising the display panel according to claim 1.

* * * * *